US007426220B2

(12) United States Patent  
Jones

(10) Patent No.: US 7,426,220 B2
(45) Date of Patent: Sep. 16, 2008

(54) METHOD AND APPARATUS FOR ALIGNING THE CLOCK SIGNALS OF TRANSCEIVERS IN A MULTIPLE ACCESS COMMUNICATION SYSTEM UTILIZING PROGRAMMABLE, MULTI-TAP PHASE-LOCKED LOOPS

(75) Inventor: DeLon K. Jones, West Bountiful, UT (US)

(73) Assignee: L-3 Communications Corporation, New York, NY (US)

( * ) Notice: Subject to any disclaimer, the term of this patent is extended or adjusted under 35 U.S.C. 154(b) by 1315 days.

(21) Appl. No.: 10/044,625

(22) Filed: Jan. 9, 2002

(65) Prior Publication Data

US 2003/0128720 A1 Jul. 10, 2003

(51) Int. Cl.
*H04J 3/06* (2006.01)
(52) U.S. Cl. ..................... 370/516; 370/362
(58) Field of Classification Search ............. 370/335, 370/342, 503, 516, 517, 518; 375/354, 356, 375/362, 371, 373, 375, 376
See application file for complete search history.

(56) References Cited

U.S. PATENT DOCUMENTS

| 5,040,193 | A  | * | 8/1991  | Leonowich et al. ......... 375/333 |
| 5,666,366 | A  | * | 9/1997  | Malek et al. ................ 370/505 |
| 5,734,301 | A  | * | 3/1998  | Lee et al. ........................ 331/2 |
| 5,986,641 | A  | * | 11/1999 | Shimamoto ................. 345/593 |
| 6,259,901 | B1 | * | 7/2001  | Shinomiya et al. ........ 455/127.3 |
| 6,297,702 | B1 | * | 10/2001 | Locker et al. .................. 331/2 |
| 6,411,143 | B1 | * | 6/2002  | Fernandez-Texon ........ 327/156 |
| 6,944,148 | B1 | * | 9/2005  | Gehring et al. ............. 370/347 |
| 6,952,456 | B1 | * | 10/2005 | Aiello et al. ................ 375/295 |
| 7,023,833 | B1 | * | 4/2006  | Aiello et al. ................ 370/348 |
| 2002/0080825 | A1 | * | 6/2002 | Wolf et al. .................. 370/517 |

* cited by examiner

*Primary Examiner*—Firmin Backer
*Assistant Examiner*—Christine Ng
(74) *Attorney, Agent, or Firm*—Perman & Green, LLP

(57) ABSTRACT

A multi-sectored, multiple access communication system provides for low-skew sector transceiver clocks by novelly utilizing a multi-tap digital Phase-Locked Loop (PLL) in the delay match circuitry of each transceiver to efficiently and inexpensively generate clock signals for each transceiver that are temporally aligned within acceptable limits of the other transceivers. The inventive system and method obviate the need for matching the lengths of all of the cables connecting the base station ("master sector equipment") to the transceivers ("slave sector equipment"), and also reduces the power requirement as a byproduct.

21 Claims, 3 Drawing Sheets

METHOD AND APPARATUS FOR ALIGNING THE CLOCK SIGNALS OF TRANSCEIVERS IN A MULTIPLE ACCESS COMMUNICATION SYSTEM UTILIZING PROGRAMMABLE, MULTI-TAP PHASE-LOCKED LOOPS

BACKGROUND OF THE INVENTION

1. Field of the Invention

The present invention broadly relates to Multiple Access communication systems. More particularly, the present invention relates to improvements in the temporal alignment of the components in Multiple Access systems.

2. Brief Description of Related Developments

Communication systems such as those involving cellular tower base stations at their center often must share limited power and bandwidth resources with a large number of users. To provide large-volume, multiple and contemporaneous access to bi-directional communication links between Access Points (APEs) associated with the base station and Customer Premises Equipment (CPE) such as mobile telephones, several access schemes have been used. In a Frequency Division Multiple Access (FDMA) scheme, users are assigned a unique communication frequency band that they may use to communicate at any time. The segregation of users according to frequency bands is not without problems including a requirement that transmitter amplifiers must often be operated in a "backed off" condition to avoid unwanted intermodulation products, as will be appreciated by those skilled in the art to which the present invention pertains.

To address the limitations FDMA, other access schemes have been used, including Time Division Multiple Access (TDMA) and Code Division Multiple Access (CDMA). In a TDMA scheme, users share a common communication frequency band; however, each user is assigned a unique time slot for communication. In a CDMA scheme, the users can communicate over the same frequency band at the same time. To distinguish communications, each carrier is modulated with a unique pseudo random code, such as by means of a direct sequence or by frequency hopping spread spectrum modulation.

Other access schemes and potential combinations of those schemes will be familiar to those skilled in the art, including, inter alia, Random Access (RA) and Demand Assigned Multiple Access (DAMA).

In multi-sectored communication systems requiring the synchronization of base station equipment (such as with synchronous CDMA schemes), there is a practical requirement that all sector equipment be synchronized to within a very small fraction of the highest expected sampling rate for proper functioning (i.e., there must be a low skew between the clocks). Because of system design requirements and eccentricities, the sector transmitters are not always equidistantly located from the master clock source. For example, in some geographic locations where a traditional communications tower is not available, the system components might be located in and around a building structure. The difference in transmission lengths causes the master clock signals to arrive out of phase at the various transmitters (relative to each other), thus leaving them in a state of asynchrony.

The three oft most approaches of the prior art to obtain clock signal synchrony at the sector transmitter equipment are 1) redesign the system so that the transmitters are equidistant from the master clock circuitry, which is not always practical, 2) match the cable lengths between each transmitter and master clock circuit, or 3) add delay matching circuitry. Matching the cable lengths may not only involve wasted resources where the differences are large, but also requires interface circuitry. Typical delay-matching circuitry is often unstable with respect to operating temperature ranges, and adds additional cost to the system.

Therefore, what is needed but non-existent in the prior art, is an approach for synchronizing transmitter clocks that are multi-distantly located from the master clock circuitry, that does not entail the additional complexity and cost of introducing interface and complicated delay matching circuits, nor entails the impractical requirement that all transmitters be located the same distance from the master clock circuit.

SUMMARY OF THE INVENTION

In view of the above-identified problems and limitations of the prior art, the present invention provides a multiple access communication system that at least includes master sector equipment adapted to control the overall operation of the system, and the master sector equipment at least including a master clock generator adapted to generate a master clock signal. The system also at least includes a plurality of slave sector equipment adapted to transmit and receive communications directly to and from Customer Premises Equipment (CPE) in the system, and for each of the slave sector equipment, a cable coupled between it and the master sector equipment for transmitting and receiving signals including the master clock signal. Each of the slave sector equipment at least includes a programmable, multiple tap slave sector phase-locked loop (PLL) receiving at an input, the master clock signal, and allowing a "phase select" tap to be chosen so that the slave sector PLL outputs a slave sector clock signal which matches within a predefined tolerance, the phase delay of the slave sector clock signal of the slave sector equipment having the longest cable coupled thereto. The system also at least includes nonvolatile memory adapted to store for each of the slave sector equipment, the appropriate "phase select" tap to satisfy the predefined delay matching tolerance.

The present invention also provides in a multiple access communication system, a method of temporally aligning the system equipment. The method at least includes the steps of, via master sector equipment, controlling the overall operation of the system, and generating via a master clock generator subsumed by the master sector equipment, a master clock signal, via a plurality of slave sector equipment, transmitting and receiving communications directly to and from Customer Premises Equipment (CPE) in the system, and for each of the slave sector equipment, coupling a cable between it and the master sector equipment for transmitting and receiving signals including the master clock signal. Each of the slave sector equipment at least includes a programmable, multiple tap slave sector phase-locked loop (PLL) receiving at an input, the master clock signal, and allowing a "phase select" tap to be chosen so that the slave sector PLL outputs a slave sector clock signal which matches within a predefined tolerance, the phase delay of the slave sector clock signal of the slave sector equipment having the longest cable coupled thereto. The method further at least includes the step of, via nonvolatile memory, storing for each of the slave sector equipment, the appropriate "phase select" tap to satisfy the predefined delay matching tolerance.

The present invention is described in detail below, with reference to the drawings.

BRIEF DESCRIPTION OF THE DRAWINGS

The foregoing aspects and other features of the present invention are explained in the following description, taken in connection with the accompanying drawings, wherein.

DETAILED DESCRIPTION OF THE PREFERRED EMBODIMENT(s)

Figure 1:
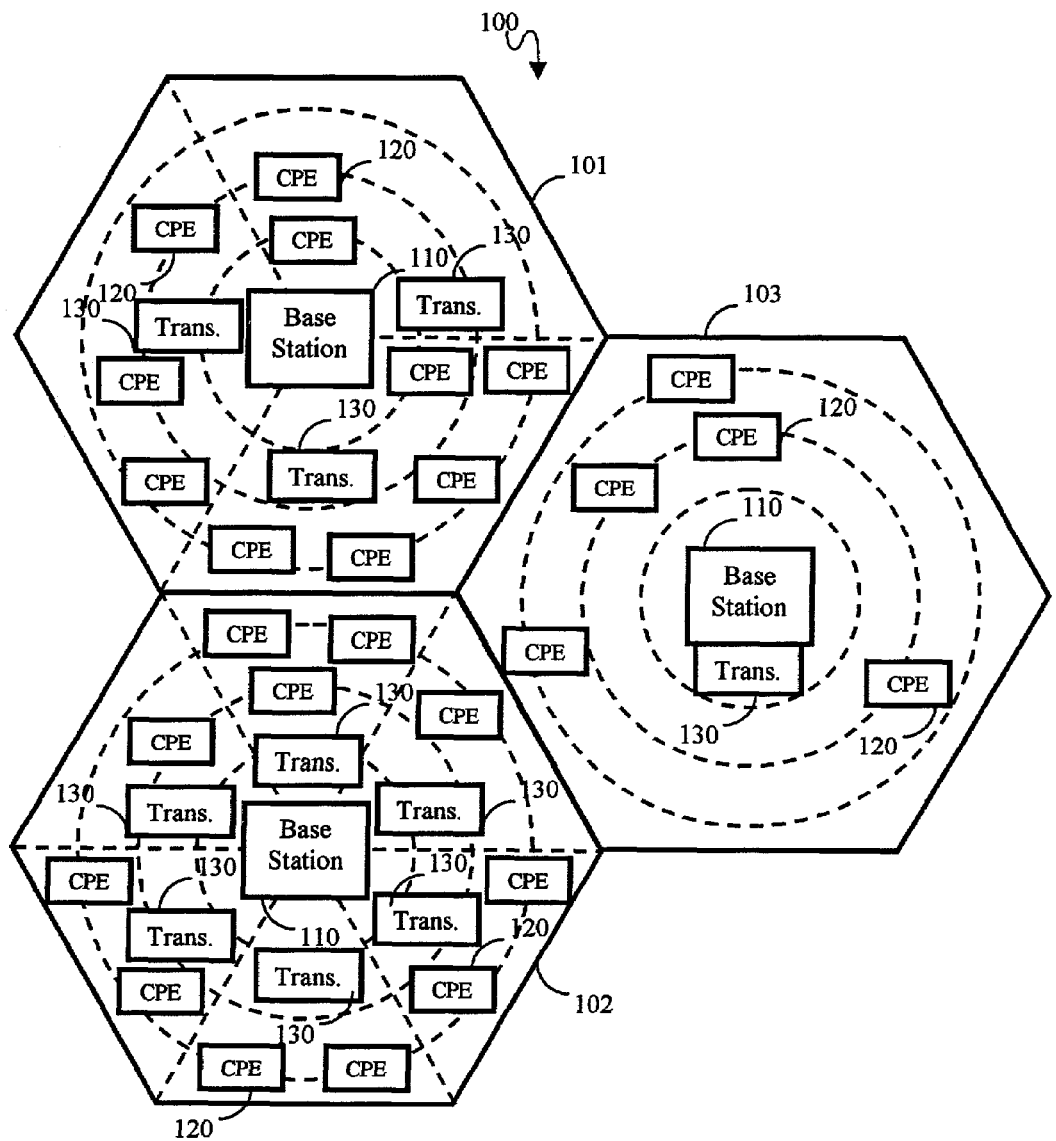
FIG. 1 is a general schematic block diagram of a synchronous Code Division Multiple Access system with transceiver clock synchronization according to the present invention.

FIG. 1 is a general schematic block diagram of a duplex communication system 100 capable of synchronous Code Division Multiple Access (CDMA), with its transceivers temporally aligned according to the present invention. As is shown in the figure, several base stations 110 and transceivers 130, which together are also known as Access Points (APEs) or "hubs," engage in duplex communication with a number of Customer Premises Equipment (CPE) devices 120, such as mobile telephones. Each hub is responsible for communicating with all of the CPEs currently located in its designated cell.

In the example of FIG. 1, each of the cells (101, 102 and 103) has a different number of sectors for illustrative purposes. Cell 101 has a three-sector configuration, while Cell 102 has a six-sector configuration. However, Cell 103 has an "omni" configuration (one sector representing 360 degrees). Those skilled in the art will appreciate that different numbers of sectors of different sizes can be included in the cells of the system 100 without departing from the essence of the present invention.

Consistent with the description of multiple access communication systems in the "Background" Section, supra., the transceivers 130 are located different physical distances from their associated base station 110. As a result, the cables (not shown) connected between the base stations and transceivers have varying lengths, giving rise to varying propagation delays of signals between the base stations and transceivers. Among those signals affected by propagation delays are the clock signals generated by the base stations and supplied to associated transceiver. Proper operation of the multiple access communication system 100 requires that the base station and transceivers have synchronized clocks.

Figure 2:
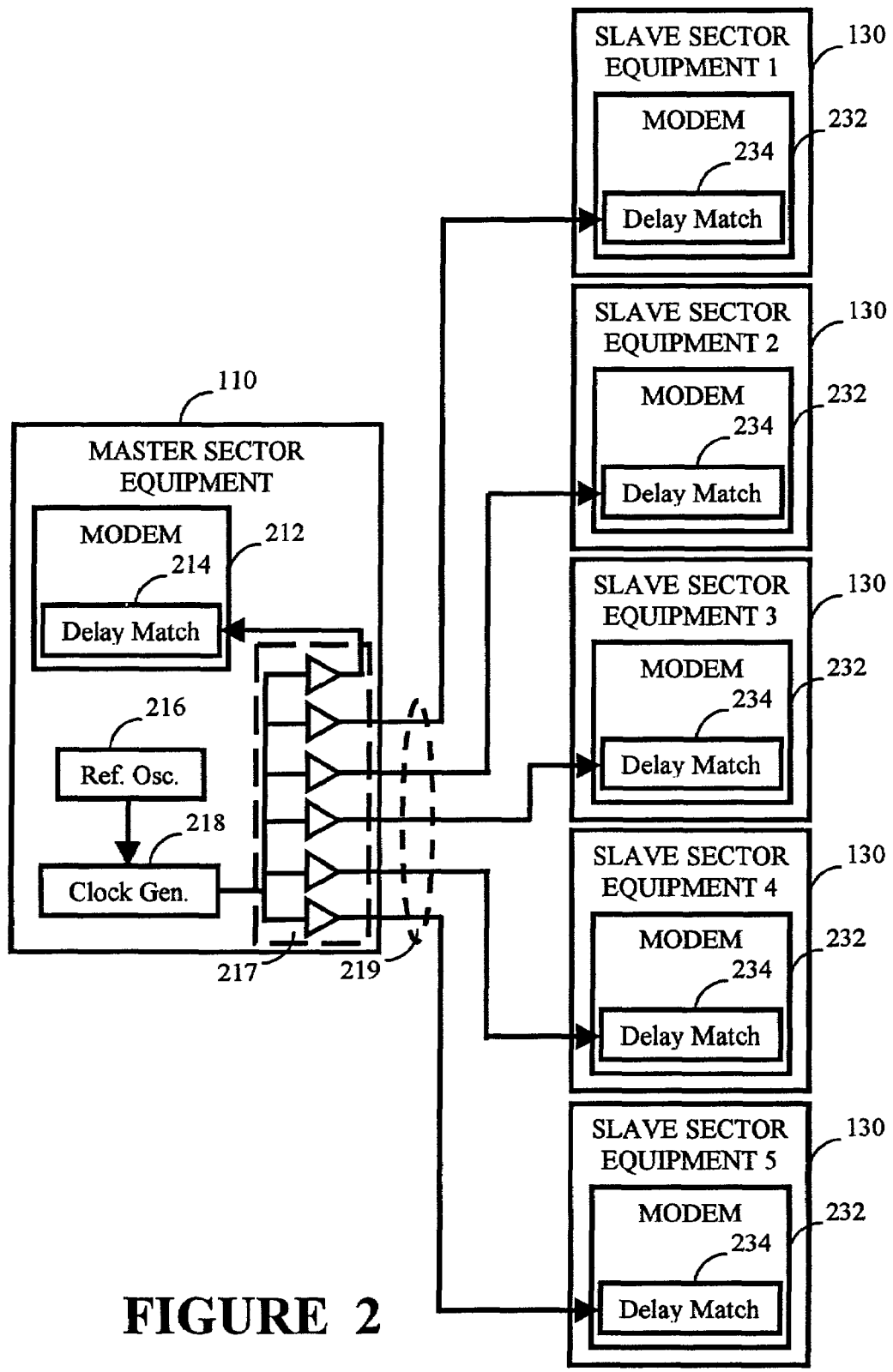
FIG. 2 is a schematic block diagram of the master sector equipment and several slave sector equipment circuits according to the present invention.

FIG. 2 details the structure of the base station and transceiver units of the present-inventive multiple access communication system 100. Also known as "master sector equipment," the base station 110 nominally includes a modulator-demodulator (MODEM) 212 for telecommunication between the base station and several transceivers 130 (also known as "slave sector equipment"), a reference oscillator 216, a clock generator 218, and driver circuitry 217. The reference oscillator supplies a stable clock signal to be utilized by the clock generator 218 to generate a master clock signal to be used by the master sector equipment and all of the connected slave sector equipment. The driver circuitry 217 boosts signals to counteract the attenuation that occurs over cables 219.

As was previously mentioned, the slave sector equipment 130 is responsible for transmitting and receiving communication signals to and from Customer Premises Equipment (CPE) within a cell area. All of the slave sector equipment operates based upon a version of the master clock signal. In the preferred embodiment, the slave sector equipment connected to the master sector equipment via the longest cable utilizes the master clock signal with no delay. However, the other slave sector equipment introduce additional delay to the master clock signal in a manner inversely proportional to the length of their connecting cables. The appropriate delay of the master clock signal is carried out in the Delay Match circuitry 234 of each of the slave sector equipment. In the preferred embodiment, the Delay Match circuitry resides in the MODEMs 234 of the slave sector equipment, although it should be appreciated by those skilled in the art that the delay match circuitry need not be so resident.

Figure 3:
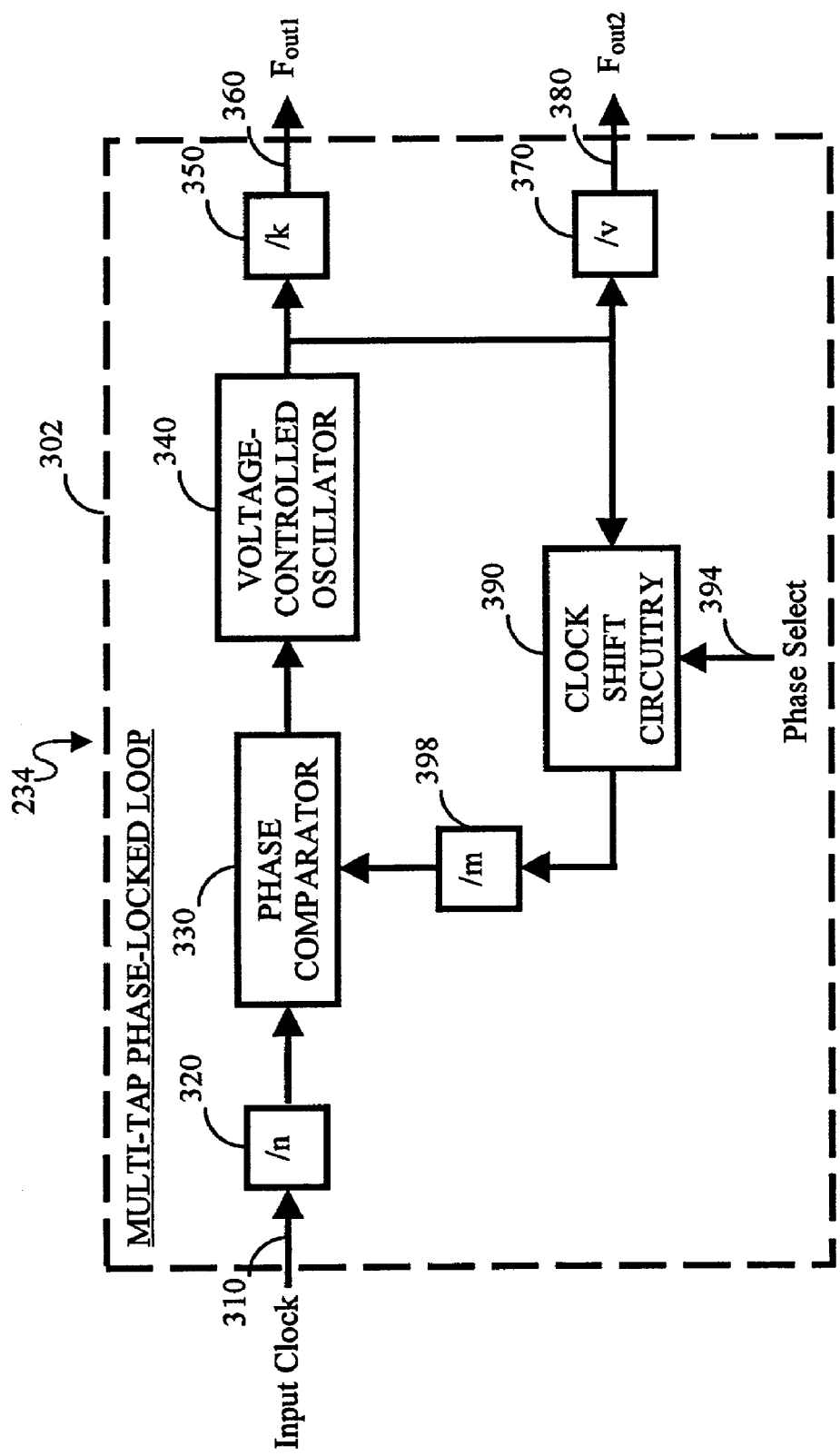
FIG. 3 is a schematic block diagram of the multiple-tap, phase-locked loop utilized in the delay match circuitry of the transceivers and base station of the present invention.

Each of the slave sector equipment generates a clock signal used to synchronize the operation of all of its components. The clock signal is based upon the master clock signal, and is also phase-aligned with the clock signals generated by the other slave sector equipment to within a predefined phase resolution (e.g., 3.6 degrees). The generation of clock signals by each of the slave sector equipment which are temporally aligned is carried out via a digital multiple tap phase-locked loop (PLL) 302, schematically illustrated in FIG. 3. In the preferred embodiment, the PLL utilized is the Apex 20KE Model manufactured by Altera Corporation. Given the teachings of this Letters Patent, those skilled in the art will appreciate that other multiple-tap PLLs can be used.

The PLL 302 has an input 31O for receiving an input clock signal, which input clock signal is the aforementioned master clock signal received over one of the cables 219 from the master sector equipment 110. The input clock signal can be frequency-divided by an input reference clock divider 320 as needed, before transferring it to an input of a phase comparator 330. After the phase comparator 330, the forward path also contains a voltage-controlled oscillator (VCO) 340 as is known in the art, and an output frequency divider 350. The signal $F_{out1}$ 360 represents the slave sector clock signal.

The feedback loop of the PLL 302 includes clock shift circuitry 390, followed by a VCO frequency divider 398. A secondary output clock signal $F_{out2}$ which is output via an output frequency divider and available at a second output node 380, is not utilized by the present invention. The clock shift circuitry 390 contains the multiple taps mentioned heretofore. That is, via a "phase select" signal 394, the PLL can be programmed to choose a tap which will cause the VCO to output a clock signal that will be phase aligned according to the length of the cable 219 connecting the slave sector equipment to the master sector equipment.

The appropriate phase select tap can be indicated by an algorithm, and then programmed into the PLL in the field when the equipment for the cell base station and transceivers are initially installed.

In the preferred embodiment, the delay match circuitry of each of the slave sector equipment contains a nonvolatile memory (not shown) for storing the phase select tap of the clock shift circuitry responsible for causing the correctly delayed clock signal. The nonvolatile memory is used in case of power failure or other problems, so that the appropriate tap is maintained without the need to realign the slave sector clock signals when none of the physical characteristics (such as the cable lengths) which would affect the master clock propagation have changed.

The master sector equipment 110 generates its own master sector clock signal, which is temporally aligned with the slave clock signals. The master sector clock signal is generated by a PLL in the master sector delay match circuitry 214 in the same manner as described supra., with respect to the generation of the slave sector clock signals. Those skilled in the art will appreciate that it is possible to align the slave sector clock signals to each other without also aligning the master sector clock signal in an alternate embodiment.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A multiple access communication system comprising:
   master sector equipment adapted to control the overall operation of said system, and said master sector equipment comprising a master clock generator adapted to generate a master clock signal;
   a plurality of slave sector equipment adapted to transmit and receive communications directly to and from Customer Premises Equipment (CPE) in the system;
   for each of the slave sector equipments, a cable coupled between it and said master sector equipment for transmitting and receiving signals including said master clock signal, wherein the length of the cable for one of the slave sector equipments may differ from the length of the cable from another of the slave sector equipments;
   each of the slave sector equipments comprising a programmable, multiple tap slave sector phase-locked loop (PLL) receiving, at an input, said master clock signal, and wherein said slave sector PLL has a phase-select tap introducing a selectable value of phase delay, and wherein for multiple ones of the slave sector equipments, the respective slave sector PLLs output slave sector clock signals of different phase delay which match within a predefined tolerance, the phase delay of the slave sector clock signals of the respective slave sector equipments to the phase delay of the slave sector equipment having the longest cable coupled thereto; and
   nonvolatile memory adapted to store for each of the slave sector equipments, a phase select tap to satisfy the predefined delay matching tolerance.

2. The system in claim 1, wherein said nonvolatile memory is distributed and self-contained among each of the slave sector equipment.

3. The system in claim 1, wherein said slave sector PLLs are subsumed by MODEMs.

4. The system in claim 1, wherein said master sector equipment further comprises a programmable, multiple tap master sector phase-locked loop (PLL) receiving at an input, said master clock signal, and allowing a phase select tap to be chosen so that said master sector PLL outputs a master sector clock signal which matches within a predefined tolerance, the phase delay of the slave sector clock signal of the slave sector equipment having the longest cable coupled thereto; and
   said nonvolatile memory is further adapted to store the phase select tap of the master sector PLL, to satisfy the predefined delay matching tolerance.

5. The system in claim 4, wherein said master sector PLL is subsumed by a MODEM.

6. The system in claim 4, wherein said master sector equipment further comprises driver circuitry coupled at its outputs to said cables, and coupled at its inputs to said master sector PLL and said master clock generator, said driver circuitry adapted to boost signal levels.

7. The system in claim 4, wherein said master sector PLL comprises:
   a forward path comprising a phase comparator and a voltage-controlled oscillator; and
   a feedback loop comprising clock shift circuitry, said clock shift circuitry comprising multiple phase select taps.

8. The system in claim 7, wherein said feedback loop further comprises a voltage-controlled oscillator frequency divider.

9. The system in claim 1, wherein said slave sector PLLs comprise:
   a forward path comprising a phase comparator and a voltage-controlled oscillator; and
   a feedback loop comprising clock shift circuitry, said clock shift circuitry comprising multiple phase select taps.

10. The system in claim 9, wherein said feedback loop further comprises a voltage-controlled oscillator frequency divider.

11. The system in claim 1, wherein said system is adapted for synchronous Code Division Multiple Access (CDMA) communication.

12. In a multiple access communication system, a method of temporally aligning system equipment comprising the steps of:
    via master sector equipment, controlling the overall operation of said system, and generating via a master clock generator subsumed by said master sector equipment, a master clock signal;
    via a plurality of slave sector equipments, transmitting and receiving communications directly to and from Customer Premises Equipment (CPE) in the system;
    for each of the slave sector equipments, coupling a cable between it and said master sector equipment for transmitting and receiving signals including said master clock signal, wherein the length of the cable for one of the slave sector equipments may differ from the length of the cable from another of the slave sector equipments;
    providing each of the slave sector equipments with a programmable, multiple tap slave sector phase-locked loop (PLL) receiving said master clock signal, introducing a selectable value of phase delay, and wherein for multiple ones of the slave sector equipments the method provides for selecting slave sector PLL output clock signals of different phase delay which match within a predefined tolerance, the phase delay of the slave sector clock signals of the respective slave sector equipments to the phase delay of the slave sector equipment having the longest cable coupled thereto; and
    via nonvolatile memory, storing for each of the slave sector equipments, a phase select tap to satisfy the predefined delay matching tolerance.

13. The method in claim 12, further comprising the step of distributing said nonvolatile memory among each of the slave sector equipment.

14. The method in claim 12, further comprising the step of subsuming said slave sector PLLs by MODEMs.

15. The method in claim 12, further comprising the step of subsuming a master sector PLL by a MODEM.

16. The method in claim 12, further comprising the steps of:
    providing said master sector equipment with driver circuitry coupled at its outputs to said cables, and coupled at its inputs to a master sector PLL and said master clock generator; and
    via said driver circuitry, boosting signal levels.

17. The method in claim 12, further comprising the steps of:
    providing for each master sector PLL, a forward path comprising a phase comparator and a voltage-controlled oscillator; and
    providing for said master sector PLL, a feedback loop comprising clock shift circuitry, said clock shift circuitry comprising multiple phase select taps.

18. The method in claim 17, wherein said feedback loop further comprises a voltage-controlled oscillator frequency divider.

19. The method in claim 12, further comprising the steps of:
providing for each of said slave sector PLLs, a forward path comprising a phase comparator and a voltage-controlled oscillator; and
providing for each of said slave sector PLLs, a feedback loop comprising clock shift circuitry, said clock shift circuitry comprising multiple phase select taps.

20. The method in claim 19, wherein said feedback loop further comprises a voltage-controlled oscillator frequency divider.

21. The method in claim 12, wherein said system is adapted for synchronous Code Division Multiple Access (CDMA) communication.

* * * * *